May 26, 1959 A. A. COLLINS 2,888,524

PARASITIC OSCILLATION SUPPRESSOR

Filed Feb. 7, 1955

INVENTOR.
ARTHUR A. COLLINS
BY Morris Moody
ATTORNEY

United States Patent Office 2,888,524

Patented May 26, 1959

2,888,524

PARASITIC OSCILLATION SUPPRESSOR

Arthur A. Collins, Cedar Rapids, Iowa, assignor to Collins Radio Company, Cedar Rapids, Iowa, a corporation of Iowa Application February 7, 1955, Serial No. 486,380

2 Claims. (Cl. 179—171)

This invention relates in general to means for suppressing parasitic oscillations, and in particular to a circuit which suppresses parasitic oscillations without causing appreciable power loss at the high frequency end of the band.

"Parasitic oscillation" refers to undesirable oscillations occurring in an oscillator or amplifier which are caused by the inter-electrode capacitance of the tube and by other stray capacitances and inductances. For example, stray inductance results from the leads attached to the tube. Parasitic oscillation is undesirable because it absorbs power that would otherwise go to generating useful output. Also, such oscillations oftentimes generate excessive voltages which can cause voltage breakdown. Distortion is also caused by parasitic oscillations.

A normal solution to prevent parasitic oscillation is to insert a resistor and inductor in parallel in the plate circuit of the oscillator or amplifier. At low frequencies the inductor presents a low impedance and thus the signal will pass through it and will not be attenuated by the resistor; however, at higher frequencies the inductor might present a substantial impedance, and thus, a portion of the desired signal may be lost due to dissipation in the resistor. High frequency parasitics are dissipated in the resistor due to the high impedance which the inductor presents.

It is an object of this invention, therefore, to provide a parasitic oscillation suppressor wherein the high frequency end of the desired passband is not attenuated.

Another object of this invention is to provide a parasitic oscillation suppressor wherein improved linearity is obtained over the entire tuning range.

A feature of this invention is found in the provision for an adjustable tap on the inductor of a parallel inductor-resistor parasitic suppressor that can be adjusted so that the upper end of the desired passband is not attenuated.

Further features, objects, and advantages of the invention will become apparent from the following description and claims when read in view of the drawing, in which:

Figure 1:
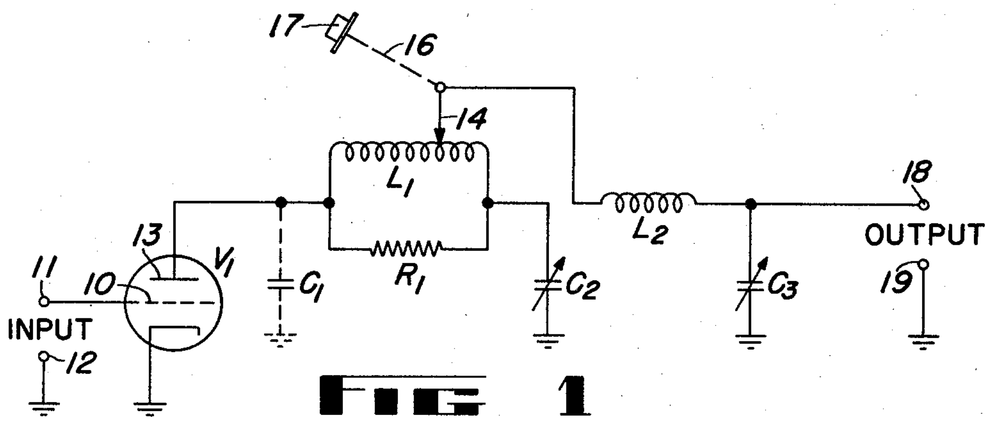
Figure 1 illustrates the invention in use in the plate circuit of a tube.

Figure 1 illustrates a tube $V_1$ which might be, for example, a power amplifier in a transmitter, which has a grid 10 connected to an input terminal 11. The other side of the input terminal 12 is connected to ground.

An input signal that is to be amplified is connected between terminals 11 and 12. The plate 13 of tube $V_1$ is connected to one end of a parallel circuit comprising inductor $L_1$ and resistor $R_1$. The opposite end of the parallel circuit is connected to a tuning condenser $C_2$.

The plate-to-ground capacitance is a stray capacitance and is shown by the dotted line and is indicated as $C_1$.

A movable contact 14 engages the inductor $L_1$ and may be moved relative thereto by a suitable shaft 16 which has a knob 17 connected to its end.

The contact 14 is connected to an inductor $L_2$. A second tuning condenser $C_3$ is connected between the other end of the inductor $L_2$ and ground. An output terminal 18 is connected to the inductor $L_2$. A second output terminal 19 is grounded. Condensers $C_2$ and $C_3$ may be tuned to resonate with $L_2$ at the frequency to be amplified.

By moving the contact 14 along the coil $L_1$ it is possible to secure a voltage balance between the stray capacitance $C_1$ and the tuning capacitance $C_2$ so that no voltage appears across the terminals of the resistor for a particular frequency. While this is true only at a given frequency, this does solve the problem of excessive dissipation in the resistor of the parasitic circuit because the balance will undoubtedly be sufficiently broad to overcome the loss over a fairly wide band of frequencies centered near the high end of the transmitter operating range. As the balance of voltage across the resistor is lost at low frequencies, then there is only a very small voltage drop across the inductor part of the parasitic suppressor, so the dissipation in the resistor is low.

In operation the contact 14 may be varied as the circuit is tuned over the frequency range so that the amount of the signal dissipated is maintained at a minimum.

Figure 2:
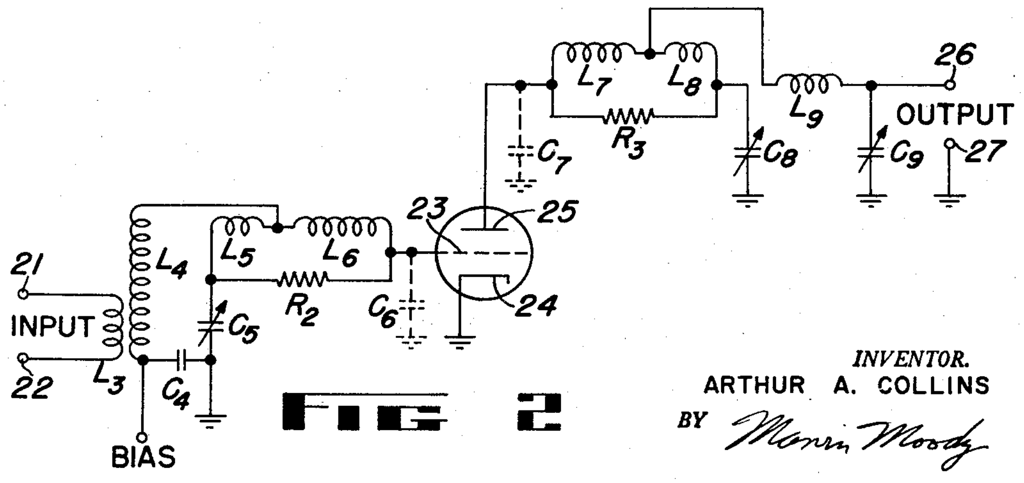
Figure 2 illustrates the invention in use in the grid and plate circuits of a tube.

Figure 2 illustrates the apparatus of this invention installed in the plate and the grid circuits of a tube. A pair of input terminals 21 and 22 are connected to the primary $L_3$ of a transformer. The secondary $L_4$ of the transformer has one end connected to a suitable bias supply and to a condenser $C_4$. The other side of the condenser $C_4$ is connected to ground.

Tuning condenser $C_5$ has one side connected to ground and the other side connected to parasitic suppressor circuit according to this invention. The suppressor circuit has a resistor $R_2$ and a pair of inductors $L_5$ and $L_6$. The inductors $L_5$ and $L_6$ are connected in series and the resistor $R_2$ is in parallel with them. The junction point between $L_5$ and $L_6$ is connected to $L_4$. The grid 23 of the tube is connected to the suppressor circuit. There is a virtual capacitance between the grid 23 and ground and this is indicated as $C_6$.

The plate 25 of the tube is connected to a second parasitic suppressor circuit comprising a resistor $R_3$ and inductors $L_7$ and $L_8$. The other side of this circuit is connected to the tuning condenser $C_8$. The junction point between $L_7$ and $L_8$ is connected to a tuning inductor $L_9$, which has its other side connected to a tuning condenser and an output terminal 26. A second output terminal 27 is connected to ground. Cathode 24 of the tube is connected to ground.

In the parasitic suppressor circuit the inductance $L_5$ and capacitor $C_5$ form a balance with the inductance $L_6$ and capacitance $C_6$ (the virtual capacitance from grid to ground).

It is to be noted that the apparatus in Figure 2 utilizes fixed connections in the parasitic suppressor circuits, rather than using a variable contact such as contact 14 shown in Figure 1. This is because oftentimes once the values of the inductors $L_5$ and $L_6$ have been determined, fixed inductances may be used and the contact point need not be varied. Thus, once the correct values of the inductances have been determined by calculation or by experimentation, no further adjustments need be made.

It is to be realized that this invention may be usable in an oscillator circuit as well as in an amplifier circuit.

Although this invention has been described with respect to a particular embodiment thereof, it is not to be so limited, as changes and modifications may be made therein which are within the full intended scope of the invention as defined by the appended claims.

What is claimed is:

1. In an electron tube amplifier stage, a parasitic oscillation suppressor circuit having low loss at a desired frequency, said amplifier comprising an electron tube, said tube having at least a cathode, a control grid, and a plate, means for applying a signal voltage between said control grid and said cathode, said suppressor circuit having a tapped first inductor and a resistor, said resistor being connected between the ends of said first inductor, the first end of said first inductor being connected to said plate, a second inductor, a first end of said second inductor being connected to the tap of said first inductor, first and second condensers connected in series between the other end of said first inductor and the other end of said second inductor to complete at said desired frequency a resonant circuit, one portion of said first inductor that is connected between said tap and said series condensers being responsive to the main current flow in said resonant circuit to induce voltage into the other portion of said first inductor that is connected outside of said main resonant circuit between said plate and said tap, the voltage induced into said portions by the current flow in said resonant circuit and the voltage induced therein by current flow to said plate being mutually 180° out of phase, the junction of said series condensers being connected to said cathode, said tap of said first inductor being positioned so that the voltages induced into said first and second portions of said first inductor substantially cancel to minimize loss in said resistor at said desired frequency, and an output circuit coupled to said resonant circuit.

2. In an electron tube amplifier stage, a parasitic oscillation suppressor circuit having low loss at a desired frequency, said amplifier comprising an electron tube, said tube having at least a cathode, a control grid, and a plate, a signal output circuit connected to said plate, said suppressor circuit having a tapped first inductor and a resistor, said resistor being connected between the ends of said first inductor, the first end of said first inductor being connected to said grid, a second inductor, an input circuit coupled to said second inductor for inducing therein signal of said desired frequency, a first end of said second inductor being connected to the tap of said first inductor, first and second condensers connected in series between the other end of said first inductor and the other end of said second inductor to complete at said desired frequency a resonant circuit, one portion of said first inductor that is connected between said tap and said series condensers being responsive to the main current flow in said resonant circuit to induce voltage into the other portion of said first inductor that is connected outside of said main resonant circuit between said control grid and said tap, the voltages induced into said portions by the current flow in said resonant circuit and the voltage induced therein by current flow to said grid being mutually 180° out of phase, the junction of said series condensers being connected to said cathode, and said tap of said first inductor being positioned so that voltages induced into said first and second portions of said first inductor substantially cancel to minimize loss in said resistor at said desired frequency.

References Cited in the file of this patent

UNITED STATES PATENTS

| | | |
|---|---|---|
| 1,897,639 | Kreer | Feb. 14, 1933 |
| 2,002,216 | Bode | May 21, 1935 |
| 2,185,388 | Wheeler | Jan. 2, 1940 |
| 2,196,266 | Landon et al. | Apr. 9, 1940 |
| 2,199,604 | Allen et al. | May 7, 1940 |
| 2,404,270 | Bradley | July 16, 1946 |
| 2,567,380 | Kingsbury | Sept. 11, 1951 |